US009253909B2

(12) United States Patent
So

(10) Patent No.: US 9,253,909 B2
(45) Date of Patent: Feb. 2, 2016

(54) PORTABLE ELECTRONIC DEVICE WITH AN ELECTRONIC MODULE

(71) Applicant: Wistron Corporation, New Taipei (TW)

(72) Inventor: Kuo-Wei So, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 185 days.

(21) Appl. No.: 14/038,731

(22) Filed: Sep. 26, 2013

(65) Prior Publication Data

US 2014/0307906 A1 Oct. 16, 2014

(30) Foreign Application Priority Data

Apr. 15, 2013 (TW) .............................. 102113285 A

(51) Int. Cl.
*H04R 1/02* (2006.01)
*H05K 7/00* (2006.01)
*G06F 1/16* (2006.01)

(52) U.S. Cl.
CPC ................ *H05K 7/00* (2013.01); *G06F 1/1616* (2013.01); *G06F 1/1688* (2013.01); *H04R 1/025* (2013.01); *H04R 1/028* (2013.01); *G06F 1/1681* (2013.01)

(58) Field of Classification Search
CPC ...... H04R 5/02; H04R 5/023; H04R 2499/15; H04R 2499/11
USPC ........................... 381/87, 333–334, 387–388; 369/679.02, 679.06
See application file for complete search history.

(56) References Cited

U.S. PATENT DOCUMENTS

| 6,243,260 | B1 | 6/2001 | Lundgren | |
|---|---|---|---|---|
| 7,453,440 | B2* | 11/2008 | Sun | ................................ 345/168 |
| 7,483,723 | B2* | 1/2009 | Soderlund | ............. H04M 1/022 455/575.1 |
| 2004/0212956 | A1* | 10/2004 | Kuivas | .................... E05D 3/122 361/679.06 |
| 2006/0034601 | A1* | 2/2006 | Andersson | ............ G06F 1/1681 396/157 |
| 2006/0078143 | A1* | 4/2006 | Yang | ............................. 381/333 |
| 2008/0159556 | A1* | 7/2008 | Ambrose et al. | ................. 381/86 |

FOREIGN PATENT DOCUMENTS

TW M262776 4/2005

OTHER PUBLICATIONS

Office action mailed on Nov. 2, 2015 for the Taiwan application No. 102113285, filing date: Apr. 15, 2013, p. 1-2 and p. 3 line 1-3.

* cited by examiner

*Primary Examiner* — Disler Paul
(74) *Attorney, Agent, or Firm* — Winston Hsu; Scott Margo

(57) ABSTRACT

A portable electronic device includes a first module, a second module, a pivoting mechanism and an electronic module. The pivoting mechanism is connected to the first module and the second module so that the second module pivots relative to the first module. The pivoting mechanism includes a pair of first fixing components, a pair of pivoting components and a pair of second fixing components. Each fixing component is fixed on the first module. Each pivoting component includes a first component and a second component, and the first component is fixed on the corresponding first fixing component. Each second fixing component is fixed on the corresponding second component and the second module. The electronic module is connected to the two second components so that the pivoting mechanism drives the electronic module and the second module to pivot simultaneously as the second module pivots relative to the first module.

10 Claims, 8 Drawing Sheets

PORTABLE ELECTRONIC DEVICE WITH AN ELECTRONIC MODULE

BACKGROUND OF THE INVENTION

1. Field of the Invention

The present invention relates to a portable electronic device, and more specifically, to a portable electronic device with an electronic module capable of moving with a pivoting mechanism simultaneously.

2. Description of the Prior Art

In the consumer market of electronic devices, a notebook computer is very popular and is used widely. The notebook computer is often equipped with a speaker module to play music and sounds. However, in order not to interfere with a narrow frame of a display screen, and to meet a requirement of a wide screen configured in the notebook computer, the speaker module is usually disposed on a host module of the notebook computer. For example, the speaker module is disposed on two sides of a keyboard of the host module or on a rear side of the host module, and an angle between the speaker module and the host module cannot be adjusted, so that the sound generated by the speaker module emits perpendicularly a top surface of the host module instead of facing a user directly. As a result, the user cannot listen to the sound at an optimum angle, such as at an angle of 45 degrees between the speaker module and the host module, to require the best sound experience. Many previous patent publications disclose that a speaker module can stand relative to the host module and is disposed on two sides of the keyboard of the host module, such as in U.S. Pat. No. 6,243,260. However, it still has to use the mechanical space of the host module beside the keyboard, whether the speaker module is designed with a hidden mechanism, resulting in an increase of a width of the host module, which cannot meet a requirement of slimness and mobility. Therefore, it is an important issue to design the speaker module which can be adjusted with different angles to face the user and does not occupy the mechanical space of the host module and the display module.

SUMMARY OF THE INVENTION

The present invention is to provide a portable electronic device with an electronic module capable of moving with a pivoting mechanism simultaneously to solve the above problems.

According to the disclosure, a portable electronic device includes a first module, a second module, a pivoting mechanism and an electronic module. The first module includes a first side, and the second module includes a second side. The pivoting mechanism is connected to the first module and the second module for pivoting the second module relative to the first module. The pivoting mechanism includes a pair of first fixing components, a pair of pivoting components and a pair of second fixing components. A first portion of each fixing component is fixed on the first side of the first module. Each pivoting component includes a first component and a second component, and the first component is fixed on a second portion of the corresponding first fixing component. A first portion of each second fixing component is fixed on the corresponding second component of the corresponding pivoting component, and a second portion of each second fixing component is fixed on the second side of the second module. The electronic module is connected to and between the two second components of the pair of pivoting components so that the pivoting mechanism drives the electronic module and the second module to pivot simultaneously as the second module pivots relative to the first module by the pivoting mechanism.

According to the disclosure, the first module is one of a host module and a display module, and the second module is the other one of the host module and the display module.

According to the disclosure, the first module is one of a keyboard module and a touch display module, and the second module is the other one of the keyboard module and the touch display module.

According to the disclosure, the first component of each pivoting component is one of a shaft and a bushing, and the second component of each pivoting component is the other one of the shaft and the bushing.

According to the disclosure, the electronic module is fixed to and between the two second components of the pair of pivoting components.

According to the disclosure, the electronic module is movably connected to and between the two second components of the pair of pivoting components.

According to the disclosure, the electronic module is driven by a torque to pivot relative to the two second components of the pair of pivoting components as the second module is fixed relative to the first module.

According to the disclosure, the electronic module is a speaker module.

According to the disclosure, the electronic module is an image capturing module.

According to the disclosure, the electronic module comprises a functional surface, and the functional surface of the electronic module is driven to expose to face a user as the second module pivots to an open position relative to the first module.

The electronic module of the portable electronic device of the present invention is capable of moving with the pair of pivoting components simultaneously, so that as the first module pivots relative to the second module, the electronic module can pivot to the desired angle simultaneously. For example, the user can pivot the electronic module to the optimum angle for receiving the sounds from the speaker module, so as to require the best sound experience. In addition, the angle of the electronic module relative to the second module varies with multistage continuous variations. As a result, the present invention solve the conventional problem that the user cannot listen to the sounds emitted from the speaker module completely and cannot require the best sound experience because an emitting angle of the sounds from the speaker is fixed, such as being perpendicular to the host module instead of facing the user in the prior art. Moreover, as the electronic module is the speaker module, the speaker module can be hidden between the first module and the second module and cannot occupy the mechanical space of the first module or the second module, so as to meet a requirement of slimness and mobility of the portable electronic device.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
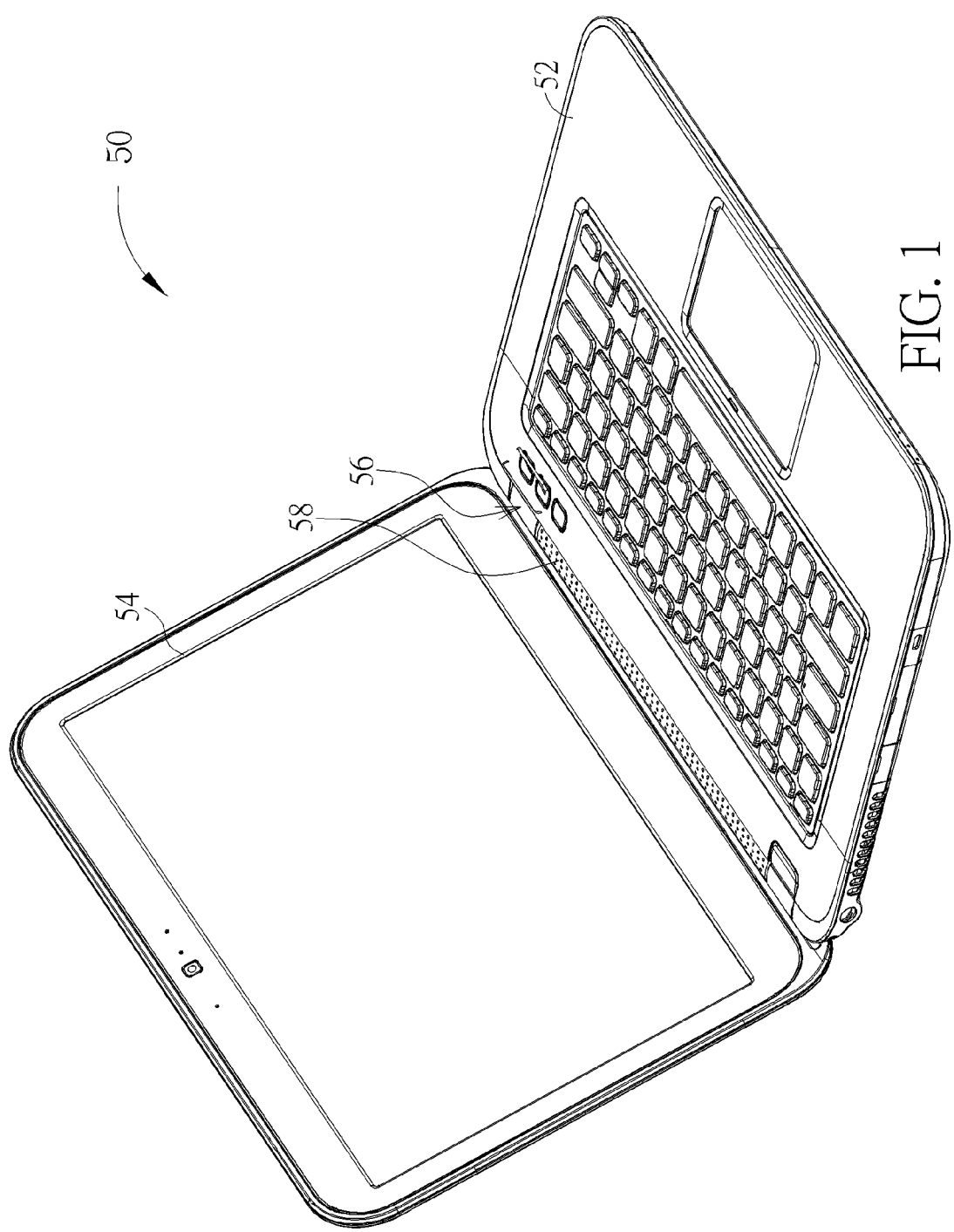
FIG. 1 is a diagram of a portable electronic device according to an embodiment of the present invention.
Figure 2:
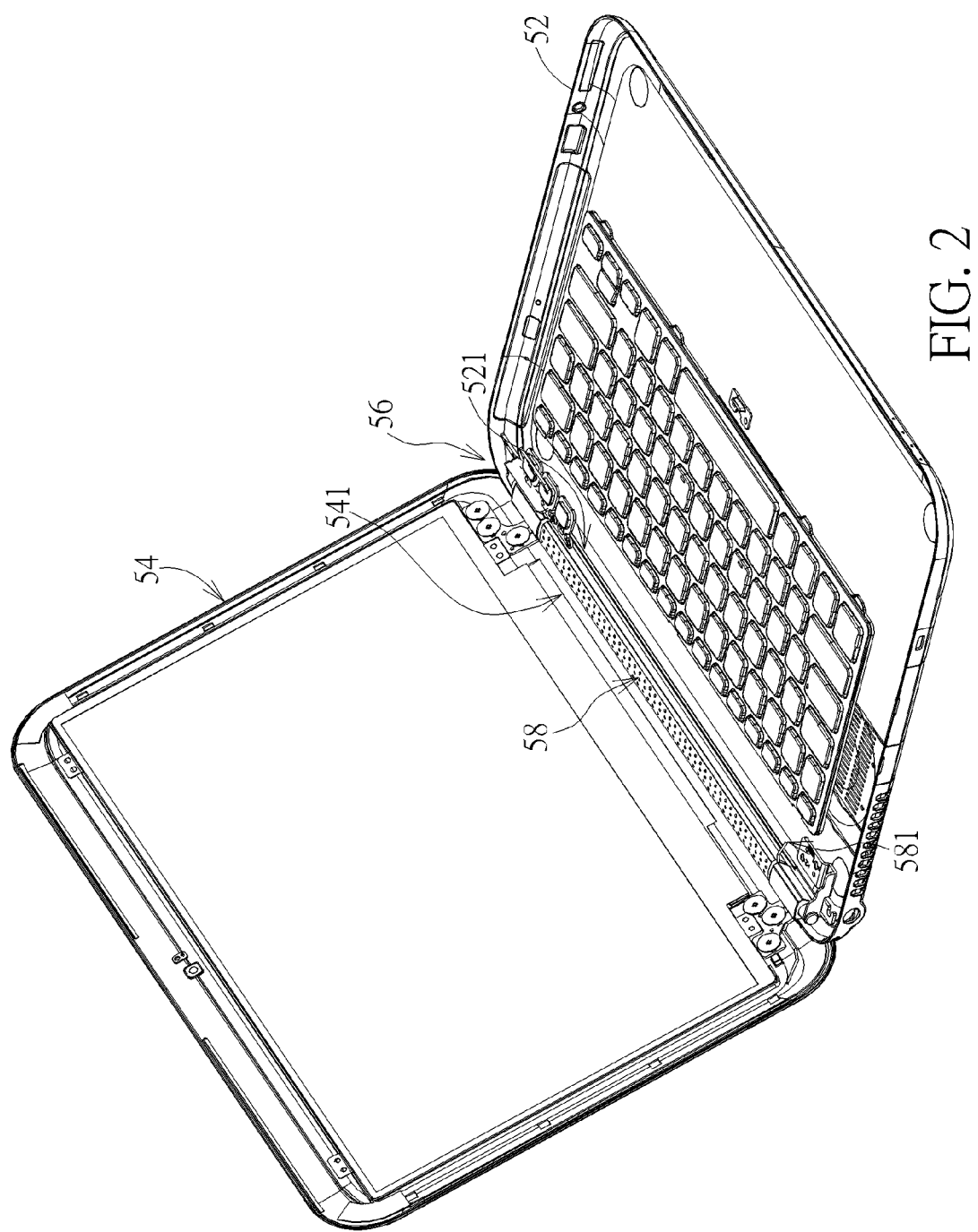
FIG. 2 is an internal diagram of the portable electronic device according to the embodiment of the present invention.

Please refer to FIG. 1. FIG. 1 is a diagram of a portable electronic device 50 according to an embodiment of the present invention. The portable electronic device 50 can be a notebook computer. The portable electronic device 50 includes a first module 52, a second module 54, a pivoting mechanism 56 and an electronic module 58. Please refer to FIG. 2. FIG. 2 is an internal diagram of the portable electronic device 50 according to the embodiment of the present invention. In order to clear illustration, a cover of the second module 54 is omitted in FIG. 2. The first module 52 can be one of a host module and a display module, and the second module 54 is the other one of the host module and the display module. In this embodiment, the first module 52 is the host module for controlling operation of the portable electronic device 50, and the first module 52 includes various electronic components, such as a CPU, a hard drive, a fan, a memory, an expansion card, and so on. The second module 54 is the display module for displaying various information of the portable electronic device 50. The second module 54 can be a liquid display module. The first module 52 includes a first side 521, and the second module 54 includes a second side 541. The pivoting mechanism 56 is connected to the first side 521 of the first module 52 and the second side 541 of the second module 54 for pivoting the second module 54 relative to the first module 52.

Figure 3:
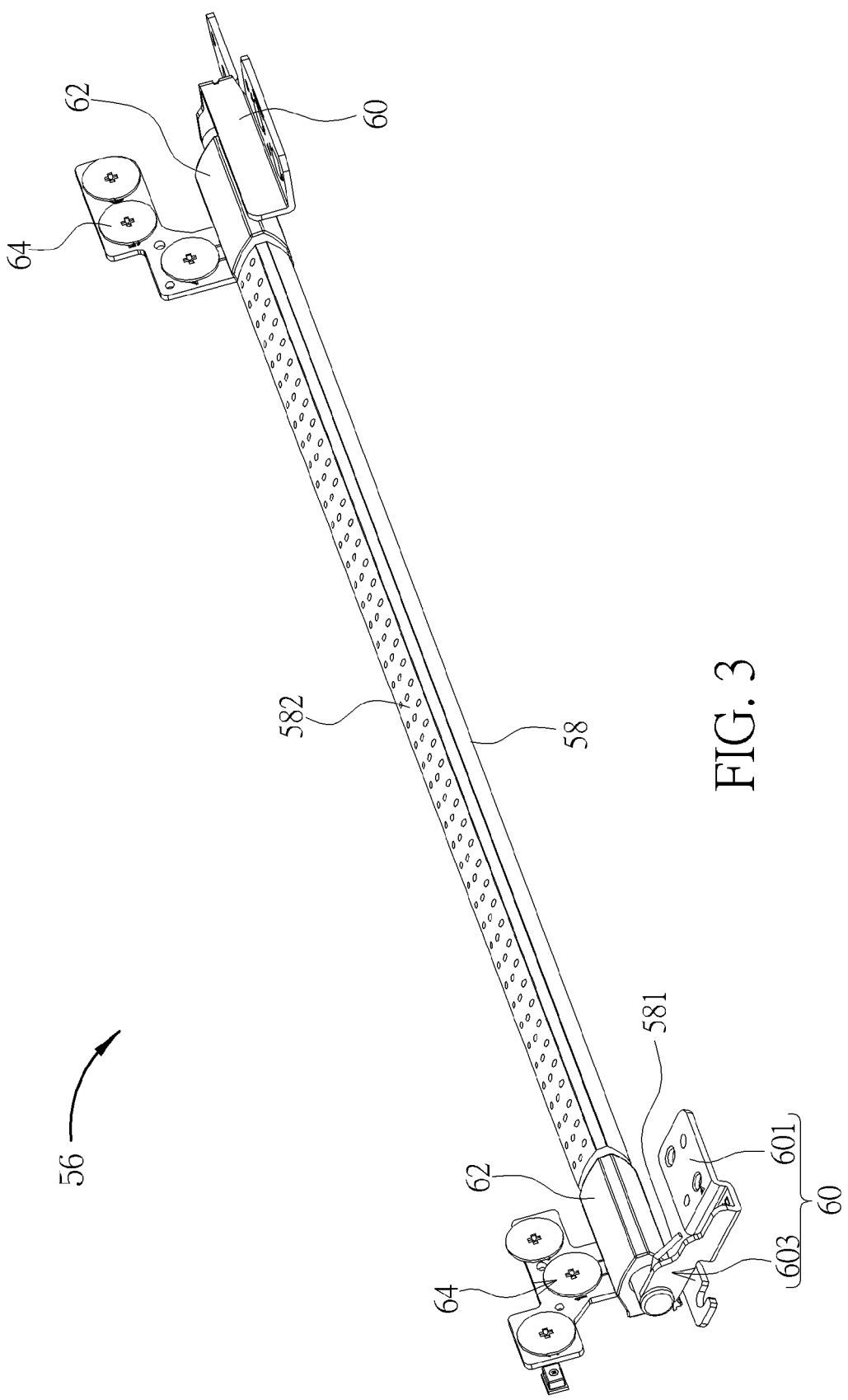
FIG. 3 is an assembly diagram of a pivoting mechanism and an electronic module according to the embodiment of the present invention.
Figure 4:
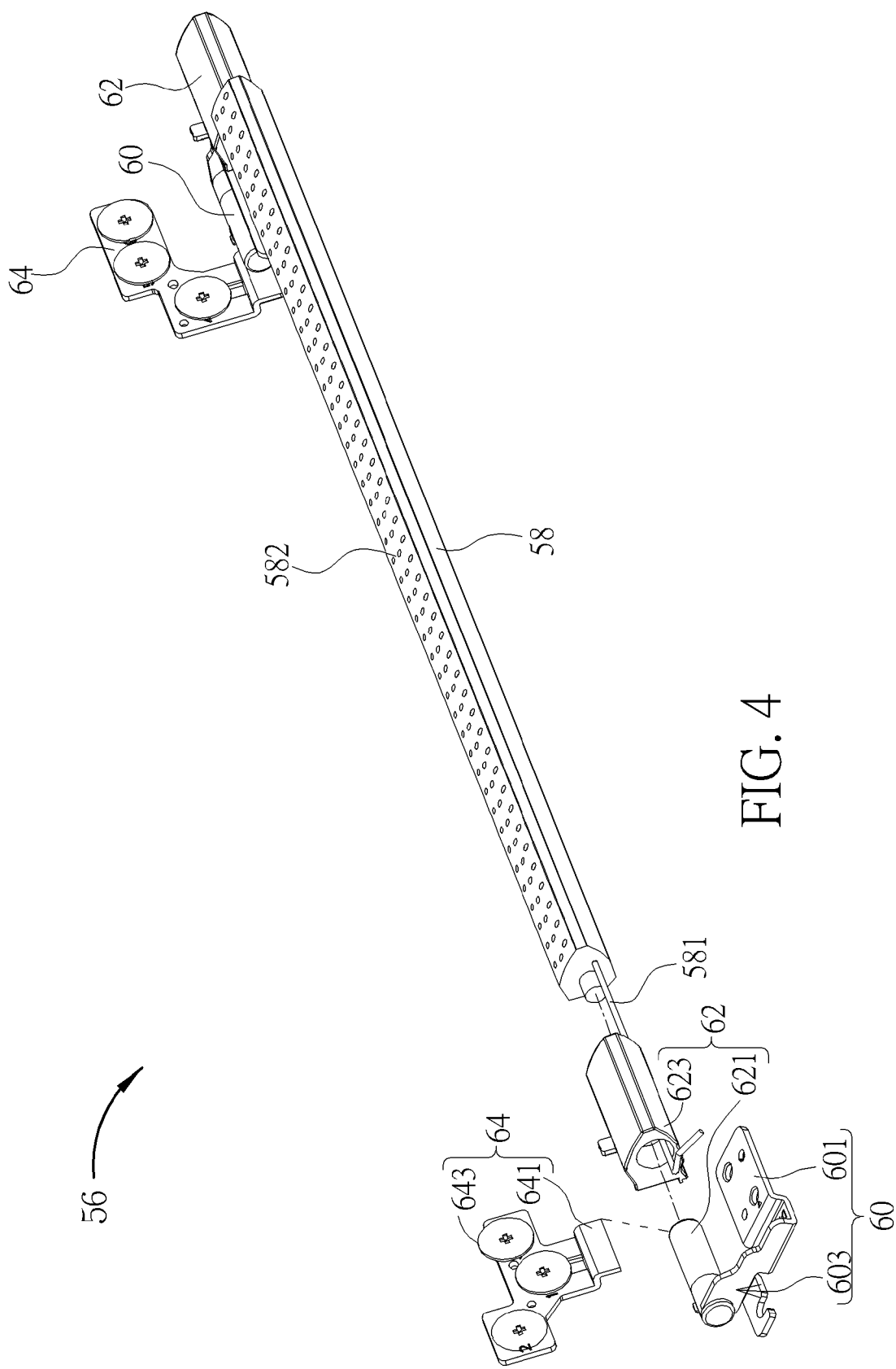
FIG. 4 is an exploded diagram of the pivoting mechanism and the electronic module according to the embodiment of the present invention.

Please refer to FIG. 1 to FIG. 4. FIG. 3 is an assembly diagram of the pivoting mechanism 56 and the electronic module 58 according to the embodiment of the present invention. FIG. 4 is an exploded diagram of the pivoting mechanism 56 and the electronic module 58 according to the embodiment of the present invention. The pivoting mechanism 56 includes a pair of first fixing components 60, a pair of pivoting components 62 and a pair of second fixing components 64. A first portion 601 of each fixing component 60 is fixed on the first side 521 of the first module 52. Each pivoting component 62 includes a first component and a second component, and the first component and the second component can pivot relative to each other. The first component of each pivoting component is one of a shaft 621 and a bushing 623, and the second component of each pivoting component is the other one of the shaft 621 and the bushing 623. In this embodiment, the first component can be the shaft 621, and the second component can be the bushing 623. The shaft 621 of each pivoting component 62 is fixed on a second portion 603 of the corresponding first fixing component 60. A first portion 641 of each second fixing component 64 is fixed on the bushing 623 of the corresponding pivoting component 62, and a second portion 643 of each second fixing component 64 is fixed on the second side 541 of the second module 54. By combining the bushing 623 and the shaft 621 of the pivoting component 62, the second fixing component 64 can pivot relative to the corresponding first fixing component 60. Therefore, the second module 54 can pivot relative to the first module 52. In another embodiment, the shaft 621 of the pivoting component 62 can be connected with the first portion 641 of the second fixing component 64, and the bushing 623 can be connected with the second portion 603 of the first fixing component 60 accordingly, which has the same effect as the above embodiment.

Moreover, the electronic module 58 is fixed to and between the two bushings 623 of the pair of pivoting components 62. As the second module 54 pivots relative to the first module 52 by the pivoting mechanism 56, the pivoting mechanism 56 can drive the electronic module 58 and the second module 54 to pivot simultaneously. Therefore, a user can adjust an angle between the electronic module 58 and the second module 54 by rotating the second module 54 relative to the first module 52, so as to meet the user's requirements. In this embodiment, the two bushings 623 of the pair of pivoting components 62 can be respectively connected to two ends of the electronic module 58, and the electronic module 58 can be connected to the two bushings 623 in a tight-fit manner or a hot melt manner, but is not limited to this. All mechanisms capable of connecting the electronic module 58 with the two bushings 623 are within the scope of the present invention. Each pivoting component 62 can be made of metal or plastic material, but is not limited to it. The material of each pivoting component 62 depends on practical design demands. In addition, in this embodiment, the electronic module 58 can be a speaker module, but is not limited to it. For example, the electronic module 58 also can be an image capturing module for capturing images of the user, so that the user can perform a video call by software installed inside the portable electronic device 50 and the electronic module 58. In addition, the electronic module 58 also can be a combination of the speaker module and the image capturing module, so as to provide a multiple function of receiving sounds and capturing images and videos. A configuration of the electronic module 58 is not limited to the speaker module, the image capturing module and the combination of the speaker module and the image capturing module described above, and it depends on practical design demands. Furthermore, as shown in FIG. 2, the electronic module 58 includes a transmission cable 581 for connecting a circuit board (not shown in figures) of the first module 52, so as to receive the electricity and signals, such as a sound signal, which are transmitted from the first module 52 to drive the electronic module 58.

Figure 5:
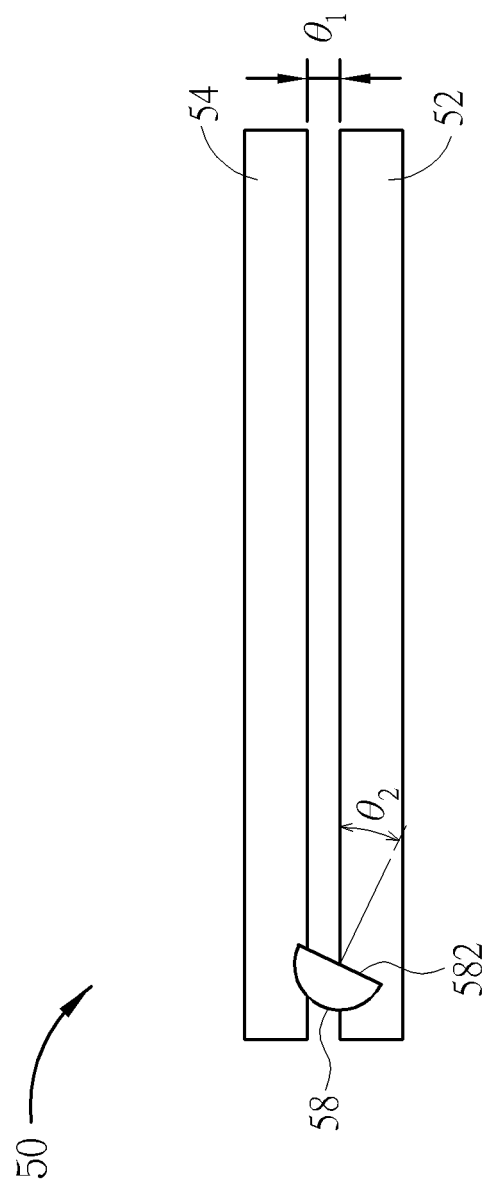
FIG. 5 and FIG. 6 are diagrams of the portable electronic device in different states according to the embodiment of the present invention.
Figure 6:
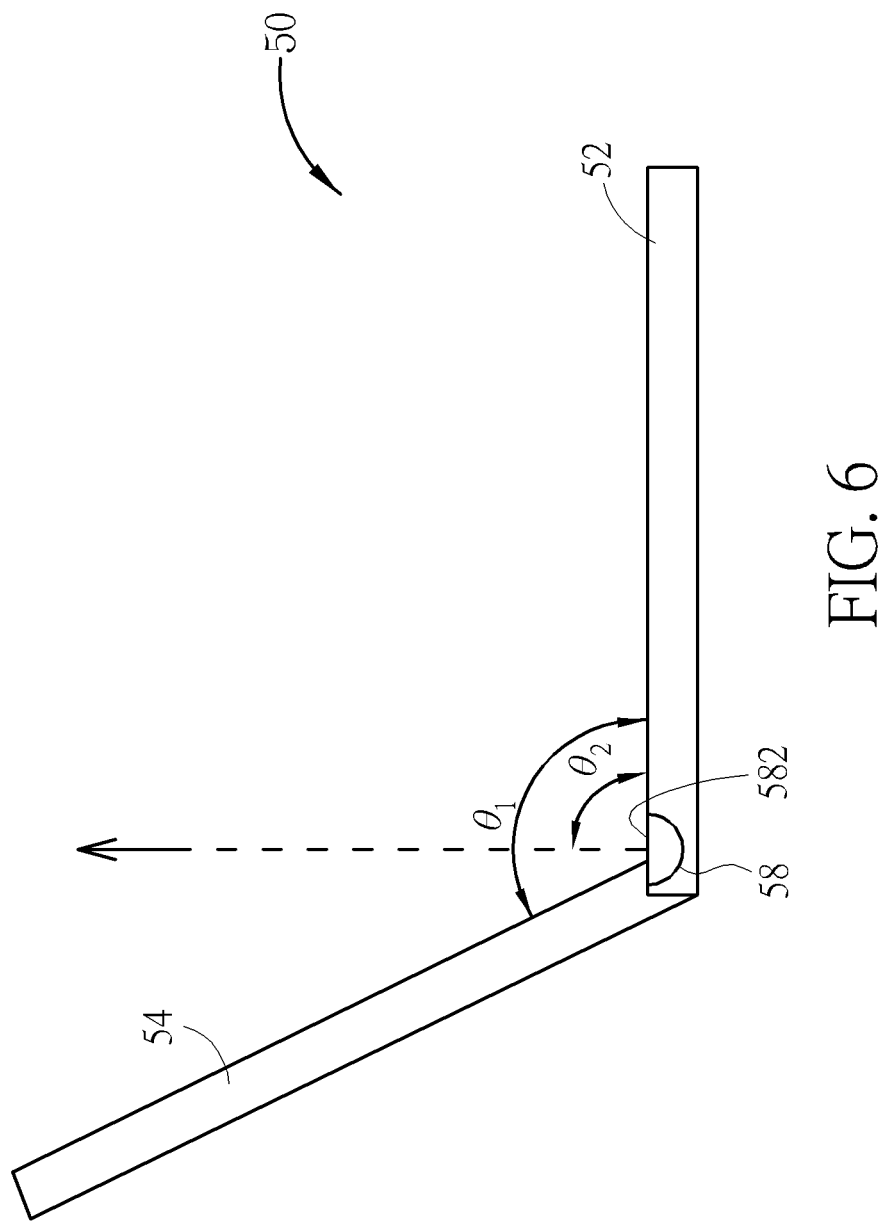

Please refer to FIG. 5 and FIG. 6. FIG. 5 and FIG. 6 are diagrams of the portable electronic device 50 in different states according to the embodiment of the present invention. The electronic module 58 includes a functional surface, and as the second module 54 pivots to an open position relative to the first module 52, as shown in FIG. 6, the functional surface of the electronic module 58 is driven to expose to face the user. As shown in FIG. 5, the portable electronic device 50 is in a closed state. That is, an angle $\theta 1$ between the second module 54 and the first module 52 is 0 degree. If the electronic module 58 is the speaker module and the functional surface is a speaker surface 582 of the speaker module accordingly, an angle $\theta 2$ between a normal axis of the speaker surface 582 and a top surface of the first module 52 can be 30 degrees. As the user open the portable electronic device 50, it means that the second module 54 pivots to the open position relative to the first module 52, the speaker surface 582 of the electronic module 58 can be driven to expose to face the user, as shown in FIG. 6. At this time, the angle $\theta 1$ between the second module 54 and the first module 52 can be substantially 120 degrees, and the angle θ2 between the normal axis of the speaker surface 582 and the first module 52 can be substantially 90 degrees. As a result, as the user uses the portable electronic device 50, the user can adjust the angle θ1 between the second module 54 and the first module 52, so as to require the optimum angle for receiving sounds from the speaker module. For, example, the angle θ2 between the normal axis of the speaker surface 582 and the first module 52 can be adjusted to 45 degrees to require the best sound experience. As the second module 54 pivots relative to the first module 52, the angle θ2 between the normal axis of the speaker surface 582 of the speaker module and the first module 52 also changes accordingly, so that it has multistage continuous variations. Therefore, the angle θ2 between the normal axis of the speaker surface 582 and the first module 52 is not limited to 90 degrees or 45 degrees. That is, the user can adjust the angle θ2 according to different requirements to get the best sound experience.

Figure 7:
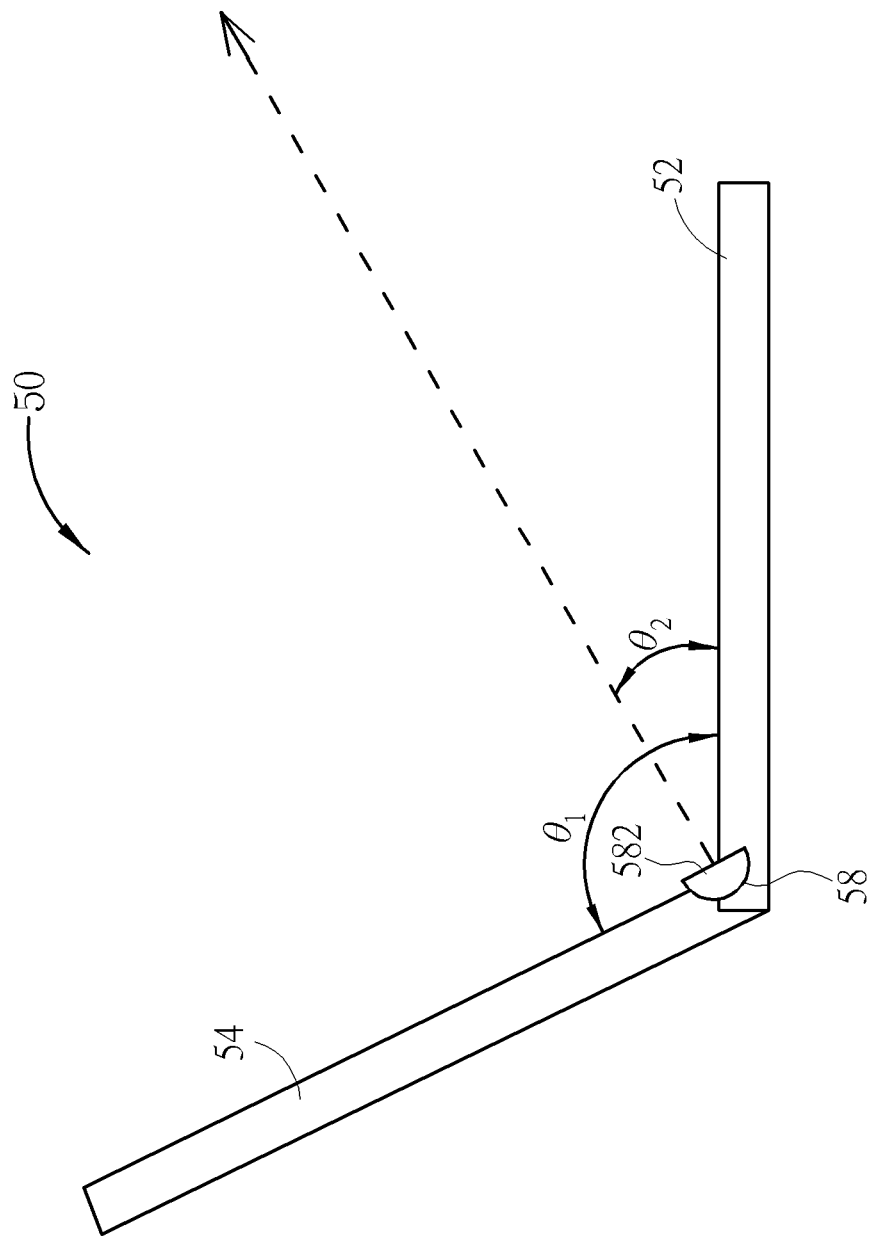
FIG. 7 is a diagram illustrating that the electronic module pivots relative to a second module according to the embodiment of the present invention.

Please refer to FIG. 3 and FIG. 7. FIG. 7 is a diagram illustrating that the electronic module 58 pivots relative to the second module according to the embodiment of the present invention. The electronic module 58 of the portable electronic device 50 of the present invention also can be designed to be driven by a torque to pivot relative to the two bushings 623 of the pair of pivoting components 62 as the second module 54 is fixed relative to the first module 52. That is, the electronic module 58 is movably connected to and between the two bushings 623 of the pair of pivoting components 62. For example, as the user is desired to listen to the sounds from the second module 54 in a lower position than a position illustrated in FIG. 6, that is the user is in the lower position, the second module 54 can keep fixed relative to the first module 52 and the electronic module 58 is pivoted relative to the pair of pivoting components 62 directly, so as to adjust the angle θ2 so that the user can receive the sound from the speaker module directly, so as to require the best sound experience.

Figure 8:
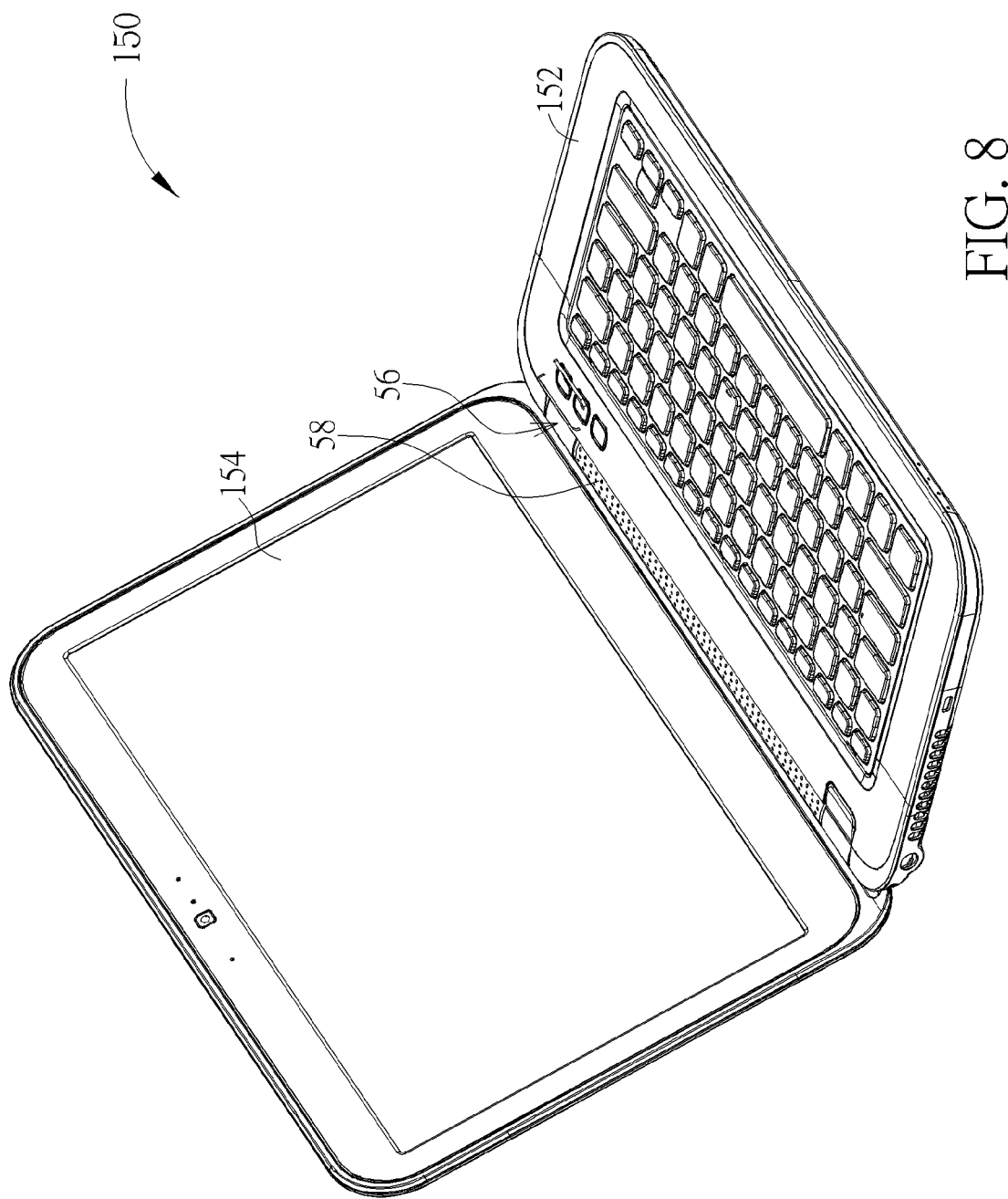
FIG. 8 is a diagram of a portable electronic device according to another embodiment of the present invention.

Please refer to FIG. 8. FIG. 8 is a diagram of a portable electronic device 150 according to another embodiment of the present invention. The first module 152 can be one of a keyboard module and a touch display module, and the second module 154 can be the other one of the keyboard module and the touch display module. In this embodiment, the first module 152 of the portable electronic device 150 is the keyboard module, and the second module 154 is the touch display module. A configuration in this embodiment is the same as a configuration in the previous embodiment, and the portable electronic device 150 also includes the pivoting mechanism 56 and the electronic module 58. In addition, the electronic module 58 also can move with the pair of pivoting components 62 simultaneously as the second module 54 pivots relative to the first module 52. That is, any portable electronic device including the pivoting mechanism 56 and the electronic module 58 capable of moving with the pair of pivoting components 62 simultaneously can achieve a purpose of the present invention. An operational principle of this embodiment is the same as an operational principle in the previous embodiment and is omitted herein.

In contrast to the prior art, the electronic module of the portable electronic device of the present invention is capable of moving with the pair of pivoting components simultaneously, so that as the first module pivots relative to the second module, the electronic module can pivot to the desired angle simultaneously. For example, the user can pivot the electronic module to the optimum angle for receiving the sounds from the speaker module, so as to require the best sound experience. In addition, the angle of the electronic module relative to the second module varies with multistage continuous variations. As a result, the present invention solve the conventional problem that the user cannot listen to the sounds emitted from the speaker module completely and cannot require the best sound experience because an emitting angle of the sounds from the speaker is fixed, such as being perpendicular to the host module instead of facing the user in the prior art. Moreover, as the electronic module is the speaker module, the speaker module can be hidden between the first module and the second module and cannot occupy the mechanical space of the first module or the second module, so as to meet a requirement of slimness and mobility of the portable electronic device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A portable electronic device comprising:
    a first module comprising a first side;
    a second module comprising a second side;
    a pivoting mechanism connected to the first module and the second module for pivoting the second module around a pivoting shaft and relative to the first module, the pivoting mechanism comprising:
        a pair of first fixing components, a first portion of each fixing component being fixed on the first side of the first module;
        a pair of pivoting components, each pivoting component comprising a first component and a second component, and the first component being fixed on a second portion of the corresponding first fixing component, the second component pivoting around the pivoting shaft and relative to the first module; and
        a pair of second fixing components, a first portion of each second fixing component being fixed on the corresponding second component of the corresponding pivoting component, and a second portion of each second fixing component being fixed on the second side of the second module; and
    an electronic module connected to and between the two second components of the pair of pivoting components so that the pivoting mechanism drives the electronic module and the second module to pivot around the pivoting shaft simultaneously as the second module pivots around the pivoting shaft and relative to the first module by the pivoting mechanism.

2. The portable electronic device of claim 1, wherein the first module is one of a host module and a display module, and the second module is the other one of the host module and the display module.

3. The portable electronic device of claim 1, wherein the first module is one of a keyboard module and a touch display module, and the second module is the other one of the keyboard module and the touch display module.

4. The portable electronic device of claim 1, wherein the first component of each pivoting component is one of a shaft and a bushing, and the second component of each pivoting component is the other one of the shaft and the bushing.

5. The portable electronic device of claim 1, wherein the electronic module is fixed to and between the two second components of the pair of pivoting components.

6. The portable electronic device of claim 1, wherein the electronic module is movably connected to and between the two second components of the pair of pivoting components.

7. The portable electronic device of claim 6, wherein the electronic module is driven by a torque to pivot relative to the two second components of the pair of pivoting components as the second module is fixed relative to the first module.

8. The portable electronic device of claim 1, wherein the electronic module is a speaker module.

9. The portable electronic device of claim 1, wherein the electronic module is an image capturing module.

10. The portable electronic device of claim 1, wherein the electronic module comprises a functional surface, and the functional surface of the electronic module is driven to expose to face a user as the second module pivots to an open position relative to the first module.

* * * * *